United States Patent [19]

Kompanek

[11] Patent Number: 4,651,044

[45] Date of Patent: Mar. 17, 1987

[54] ELECTROACOUSTICAL TRANSDUCER

[76] Inventor: Harry W. Kompanek, 153 Rametto Rd., Santa Barbara, Calif. 93108

[21] Appl. No.: 134,160

[22] Filed: Mar. 25, 1980

Related U.S. Application Data

[63] Continuation of Ser. No. 934,360, Aug. 17, 1978.

[51] Int. Cl.[4] .................... H01L 41/08

[52] U.S. Cl. .................... 310/323; 310/328; 310/334; 310/339; 310/369; 310/317

[58] Field of Search .................... 310/321-323, 310/328, 334, 338, 369, 371

[56] References Cited

U.S. PATENT DOCUMENTS

| | | | |
|---|---|---|---|
| 2,812,452 | 11/1957 | Harris | 310/322 |
| 3,043,967 | 7/1962 | Clearwaters | 310/337 X |
| 3,100,291 | 8/1963 | Abbott | 310/322 X |
| 3,142,035 | 7/1964 | Harris | 310/337 X |
| 3,177,382 | 4/1965 | Green | 310/337 X |
| 3,182,284 | 5/1965 | Green | 310/337 X |
| 3,277,433 | 10/1966 | Toulis | 310/322 X |
| 3,702,948 | 11/1972 | Balamuth | 310/323 |
| 3,982,144 | 9/1976 | Rogers et al. | 310/337 X |

*Primary Examiner*—Mark O. Budd

*Attorney, Agent, or Firm*—Ellsworth R. Roston; Charles H. Schwartz

[57] ABSTRACT

An electroacoustical transducer includes a tubular member. The member has a gap extending the axial length of the member with a restricted circumferential length. The member has a particular thickness and/or diameter to vibrate at a particular frequency.

A plurality of polarized sectionalized transducer elements are in closely stacked relationship within the member to provide unrestrained vibrations of the member at the ends defining the gap. The elements are bonded to the member to vibrate at the particular frequency in accordance with the introduction of alternating current signals to the elements. Means are operatively coupled to the transducer elements to introduce alternating current signals to the elements to produce vibrations of such elements.

In one embodiment, the elements are disposed in an annular configuration in abutting relationship to one another and are bonded to the inner wall of the tubular member. In another embodiment, the elements are disposed in a linear configuration in abutting relationship to one another and are bonded to the inner wall of the tubular member at diametrical positions equally spaced from the gap. The elements are circumferentially polarized. An output member may be coupled to the tubular member at the position of the gap to vibrate with the tubular member.

A plurality of transducers constructed as disclosed above may be disposed in stacked relationshp. The gaps in the tubular members of such transducers may be annularly displaced in phase to produce a particular directional pattern to the acoustic waves produced by such transducer array.

2 Claims, 6 Drawing Figures

FIG. 1
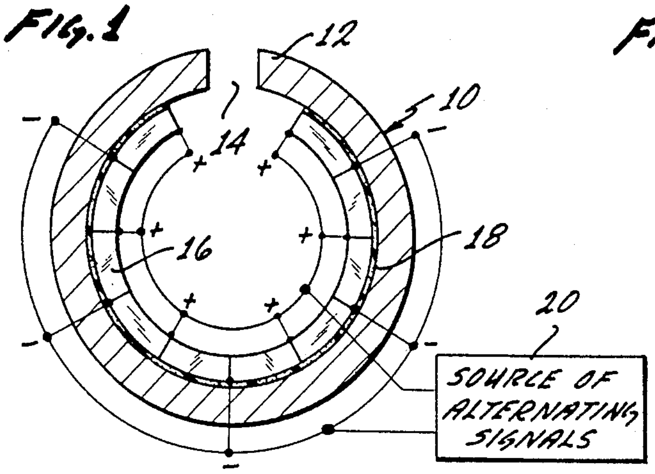
FIG. 2
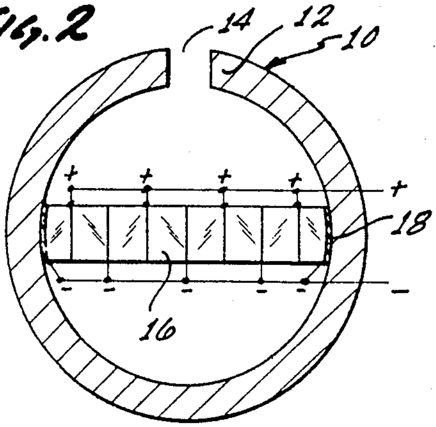
FIG. 3
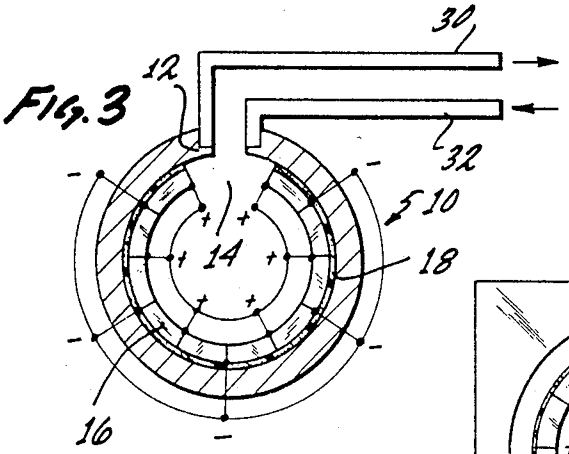
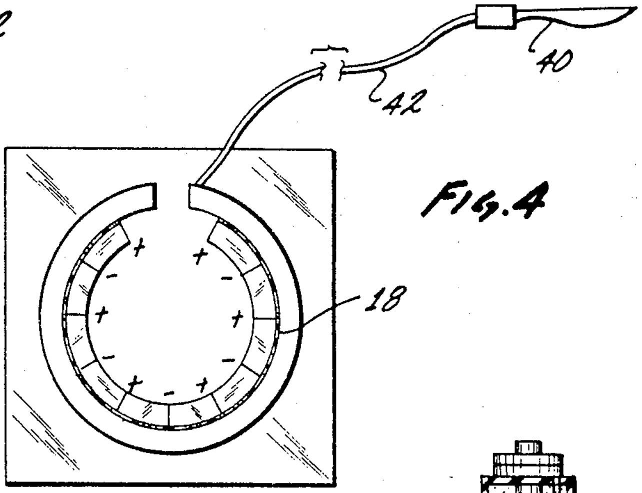
FIG. 4
FIG. 5
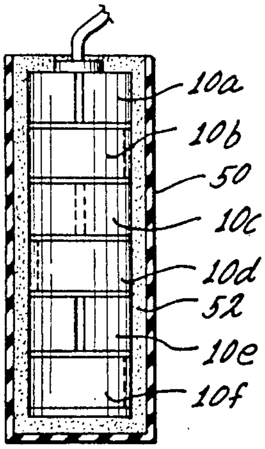
FIG. 6
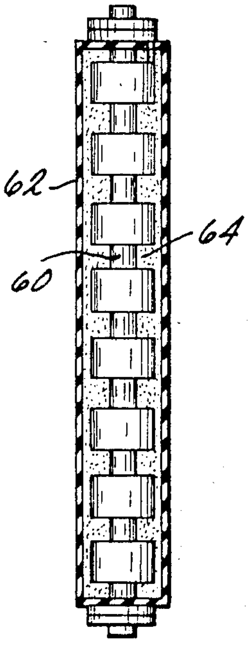

ELECTROACOUSTICAL TRANSDUCER

This is a continuation of application Ser. No. 934,360 filed Aug. 17, 1978.

This invention relates to electroacoustical transducers. More particularly, the invention relates to transducers which are capable of producing large amounts of power at a low frequency in the order of several kilocycles or less. The transducer constituting this invention is especially advantageous because it produces large amounts of power at frequencies which can be accurately controlled by such simple parameters as the thickness or diameter of an external member in the transducer.

Electroacoustical transducers are advantageous because they provide a conversion between electrical energy and acoustical energy. For example, when alternating current signals are introduced to an electroacoustical transducer, the transducer vibrates and produces acoustical energy in accordance with such vibrations. The conversion of electrical energy to acoustical energy has a number of different uses such as in loud speakers and in sonar applications.

Electroacoustical transducers have been known for a considerable number of years. In that period of time, considerable work has been done to perfect the transducers. In spite of this, several basic problems still remain. for example, a satisfactory transducer does not exist with properties of producing large amounts of acoustical energy at low frequencies in the order of two kilocycles or less. It has also been difficult to provide desired values of frequencies of two kilocycles or less. It has been further difficult to provide electroacoustical transducers which operate with considerable efficiency to provide large power outputs at precisely controlled frequencies. Such deficiencies still exist in electroacoustical transducers in spite of the fact that considerable effort has been devoted through the years to develop a transducer which overcomes these problems.

This invention provides a transducer which overcomes the above difficulties. The transducer converts electrical energy to acoustical energy of considerable power and produces this conversion with an efficiency factor greater than that capable of being provided in the prior art. The transducer is also constructed to provide acoustical frequencies of precise value in a low range of approximately two kilohertz or less. The transducer also can be adapted easily to provide acoustical energy at any desired frequency by adjustments of such external parameters as the thickness or diameter of an external ring or tubular members in the transducer.

The transducer includes a ring or tubular member which is provided with a gap at a circumferential position in the ring. The gap extends the axial length of the member and has a restricted circumferential length. The member has a particular frequency. The member may be made from a suitable member such as steel so as to have elastic properties.

A plurality of polarized sectionalized transducer elements are disposed in closely stacked relationship within the tubular member to provide unrestrained vibrations of the member at the ends defining the gap. The transducer elements are bonded to the tubular member to vibrate at the particular frequency in accordance with the introduction of alternating current signals to the elements. The transducer elements are preferably polarized circumferentially. Means are operatively coupled to the transducer elements to introduce alternating current signals to the elements to produce vibrations of such elements.

In one embodiment, the elements are disposed in an annular configuration in abutting relationship to one another and are bonded to the inner wall of the tubular member. In another embodiment, the elements are disposed in a linear configuration in abutting relationship to one another and are bonded to the inner of the tubular member at diametrical positions equally spaced from the gap.

An output member may be coupled to the tubular member at the position of the gap to vibrate with the tubular member at one end of the gap. The output member may operate as a pile driver or trench digger or as a gravel packer. The output member may be connected directly to the tubular member at the end of the gap or may be coupled to the tubular member through a flexible shaft. When the output member is coupled to the tubular member through a flexible shaft, it may be used as a replaceable knife, drill or surgical blade. A second output member may also be coupled to the tubular member at the other end of the gap to vibrate with the tubular members. The second output member is reciprocated in one direction as the first output member is reciprocated in an opposite direction.

By including a tubular member with a gap as the power element, the transducer constituting this invention produces acoustical energy with directional properties. A plurality of such transducers may be stacked in a particular phase relationship to produce acoustical energy through an extended axial length with nondirectional properties. The transducers in the plurality may also be stacked in a phase relationship to produce acoustical energy having directional properties of any desired characteristics. Stacked arrangements of the transducers of this invention may be used as a sonic tool in oil wells, as a sonobuoy and in sonar installations.

IN THE DRAWINGS

FIG. 1 is a sectional view of a transducer constituting one embodiment of the invention;

FIG. 2 is a sectional view, similar to FIG. 1, of a second embodiment of the invention;

FIG. 3 is a sectional view of a tool incorporating the transducer of FIG. 1 and having properties useful in such equipment as a pile driver or a trench digger;

FIG. 4 is a schematic sectional view of a tool incorporating the transducer of FIG. 1 and having properties useful in such applications as a knife, drill or surgical blade;

FIG. 5 is a schematic illustration of an array of a plurality of transducers each constructed as shown in FIGS. 1 or 2 and having properties useful in such equipment as a sonar transducer; and FIG. 6 illustrates an array of transducers constructed as shown in FIGS. 1 or 2 and useful as a sonic tool for oil wells.

An electroacoustical transducer generally illustrated at 10 is shown in FIG. 1 as the preferred embodiment of the invention. The transducer 10 includes a tubular member 12 with a gap 14. The gap 14 has a relatively short circumferential length and extends axially along the full length of the member 12. The member 12 is preferably made from a metal such as a steel having elastic properties. The thickness and diameter of the metal ring are selected to produce vibrations, in the nature of the vibrations of a tuning fork, at a preselected frequency. Preferably this frequency is in a low range such as a range between approximately two (2) kilohertz and four hundred (400) hertz.

A plurality of sectionalized transducer elements 16 are arrayed within the member 12 in abutting and progressive relationship to one another and in abutting relationship to the inner wall of the member 12. The sectionalized elements 16 are preferably provided with equal circumferential lengths and thicknesses and are disposed in symmetrical relationship to the member 12, and particularly in symmetrical relationship to the gap 14 in the member. The sectionalized elements 16 may be made from a suitable ceramic material having piezoelectric characteristics. The elements 16 are bonded to the inner wall of the member 12 by any suitable adhesive 18. The adhesive 18 has properties for insulating the sectionalized elements from the tubular member 12. The ceramic material for the elements 16 and the adhesive 18 are well known in the art.

The sectionalized elements 16 are preferably polarized circumferentially rather than through the wall thickness. Such a polarization is designated in the art as a "$D_{33}$ mode". Circumferential polarization of the elements provides the transducer 10 with a relatively high coupling coefficient such as a coefficient of at least fifty percent (50%). This high coupling coefficient facilitiates the production of a good bond between the sectionalized elements and enhances efficiency in the conversion of electrical energy to acoustical energy. Alternating current signals are introduced to the sectionalized elements 16 from a source 20. The introduction of such signals to the elements in the plurality may be provided on a series or parallel basis.

When alternating current signals are introduced from the source 20 to the elements 16, the signals produce vibrations of the sectionalized elements 16. These vibrations in turn produce vibrations in the tube 12, which functions in the manner of a tuning fork. The frequency of these vibrations is dependent somewhat upon the characteristics of the sectionalized elements such as the thickness and diameter of the ring 12. As a result, for a ring 12 of a particular diameter, the resonant frequency of the transducer 10 may be primarily controlled by adjusting the thickness of the ring 12.

The embodiment shown in FIG. 1 has certain important advantages. It provides a conversion of electrical energy to acoustical energy at low frequencies such as frequencies in the order of two (2) kilohertz or less. The frequency of the acoustical energy can be precisely controlled. Furthermore, the transducer provides a relatively large amount of energy since the ring 12 can be provided with sturdy characteristics by the selection of a suitable metal such as steel and by the provision of an adequate thickness for the ring. In addition, the use of sectionalized elements 16 inhibits any cracking of the transducer member formed by such elements even when the elements 16 are subjected to a considerable amount of electrical energy.

The formation of the transducer 10 from the ring 12 and the sectionalized elements 16 is further advantageous since the efficiency in the transfer of energy from electrical energy to mechanical movement is materially enhanced over that obtained in the prior art. For example, the embodiment of FIG. 1 obtains an efficiency of approximately sixty percent (60%) in the conversion of electrical energy to mechanical movement. This is in contrast to efficiencies of approximately thirty one percent (31%) obtained from similar conversions in the prior art.

FIG. 2 illustrates a second embodiment of the transducer constituting this invention. The embodiment shown in FIG. 2 is not as advantageous as the embodiment shown in FIG. 1 since it does not produce as much mechanical energy from a given amount of electrical energy as the embodiment shown in FIG. 1. However, the embodiment shown in FIG. 2 is less expensive to manufacture than the embodiment shown in FIG. 1 since it is easier to stack the sectionalized elements in FIG. 2 than the sectionalized elements in FIG. 1.

The embodiment shown in FIG. 2 includes a metal tube 12 corresponding to that shown in FIG. 1 and further includes sectionalized elements 22. In the embodiment shown in FIG. 2, the sectionalized elements 22 are linearly stacked in abutting relationship to one another and are attached to the inner wall of the tube 12 at diametrical positions equally spaced from the ends of the gap 14. The elements 22 at the end of the stack are suitably bonded to the inner wall of the tubular member 12. Thus, when alternating current signals are introduced to the sectionalized elements, the elements vibrate and produce vibrations in the tube 12. The vibrations of the tube 12 at positions adjacent to the gap 14 in FIG. 2 are similar to the vibrations of the tube 12 adjacent to the gap 14 in FIG. 1.

In the embodiment shown in FIG. 3, a pair of driving rods 30 and 32 are connected to the ends of the tubular member 12 at a position adjacent the gap 14. Thus, the rods 30 and 32 move reciprocally in accordance with the vibrations of the tube 12. The rods 30 and 32 reciprocate in a push-pull relationship such that one of the rods is moving to the right at the same time that the other rod is moving to the left as the tube 12 expands and contracts.

With high power, the rods 30 and 32 can work in such equipment as a pile driver or a trench digger. The frequency of the reciprocatory movement of the rods 30 and 32 can be approximately four hundred (400) hertz when the tubular member 12 has a diameter of at least one foot (1'0") and a wall thickness of approximately five eighths of an inch (⅝") and has capabilities of being driven at a very high power such as a power of at least eight (8) kilowatts.

FIG. 4 shows the use of the transducer of FIG. 1 as a "remote" sonic system. In the embodiment shown in FIG. 4, the transducer 10 is coupled to a replaceable knife 40 through a flexible shaft 42. The use of the flexible shaft 42 provides the housing of the transducer 10 and the source 20 with a position displaced from an operator holding the knife 40. The flexible shaft 42 has a transverse modulus capable of propagating to the knife 40 the sound waves generated by the transducer 10. A system such as shown in FIG. 4 has a number of different applications including cutting, drilling and massaging. The system has particular utility for doctors and other medical personnel.

FIG. 5 schematically illustrates the use of a plurality of the transducers of FIGS. 1 and 2 in an array having utility as a sonar transducer. The array is shown as being formed from six transducers. These transducers are respectively designated as **10*a*, 10*b*, 10*c*, 10*d*, 10*e* and 10*f***. However, any particular number of transducers can be used. The transducers in the array can be connected electrically in series or in parallel depending upon the pattern of the acoustical beam to be produced.

The array can be encapsulated in a steel or rubber boot 50 which can be filled with oil 52.

The transducers 10*a* through 10*f* are disposed with their gaps 12 in a particular phase relationship to one another in the annular direction. For example, as shown in FIG. 5, the gaps 14 for each of the successive transducers are shown as being rotated 90° from the adjacent transducer. By providing the transducers with their gaps in such a phase-displaced relationship, the power obtained from the array can be optimized in an omnidirectional relationship.

The acoustical power from the array can be directed in a beam having any directional properties desired by providing a proper phase relationship for the gaps in the different transducers. Such a phase relationship can be obtained by rotating the transducers so that their gaps face in particular directions relative to one another.

A plurality of transducers can also be mounted on a vertical rod 60 such as shown in FIG. 6. The length of this rod depends upon the area to be actuated acoustically. For example, eight transducers are shown in FIG. 6 as being mounted on the rod 60 in equally spaced relationship. Each of the transducers may be constructed as shown in FIGS. 1 or 2. Each of the transducers is shown as being rotated approximately 90° from the transducer directly above it. This provides for an acoustical output having omnidirectional characteristics in the "near field" condition.

In an actual construction of the embodiment shown in FIG. 6, all of the transducers were electrically connected in parallel. Each transducer was made of steel and was provided with an outer diameter of approximately three inches (3") and with a wall thickness of approximately one eighth inch (⅛"). Ten ceramic elements were rigidly bonded together to define an almost complete cylinder and were rigidly bonded to the inner wall of the steel cylinder.

The eight transducers were disposed in equally spaced relationship on the rod 60, which was provided with a length of approximately four feet (4.0'). The transducers and the rod were disposed in a boot 62 which was filled with oil 64. The boot was made from a thin sheet of stainless steel and was provided with an outer diameter of approximately three and one half inches (3.5"). The resultant tool was inserted in an oil well to pack gravel in the oil well. The tool operated at a frequency of approximately twenty two hundred (2200) hertz.

The arrays shown in FIGS. 5 and 6 have certain important advantages since they are assemblied from pluralities of the transducers shown in FIGS. 1 and 2. The arrays provide large amounts of acoustical power at high efficiencies and at controlled frequencies. Furthermore, the arrays provide such power over extended axial lengths. The power can be delivered on an omnidirectional basis or on a directional basis of any three-dimensional characteristics desired, depending upon the use to be provided for the array.

Although this application has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. In combination, an annular ring split at one position to define a gap at such position and to define ends at such gap and having an inner surface and free for displacement at substantially every position on its annular surface, a transducer formed from a plurality of polarized sectionalized elements within the split ring with the elements arranged in stacked and abutting relationship to one another and to the split ring to maintain the gap within the ring, each of the sectionalized elements in the transducer engaging the inner surface of the ring at spaced positions along such inner surface to vibrate in a circumferential mode and being circumferentially polarized to provide for a vibration of the ends of the ring defined by the gap in accordance with the introduction of alternating electrical signals to the transducer, and means for introducing alternating electrical signals to the transducer at a particular frequency to obtain mechanical oscillations of the ring at a frequency related to the frequency of such alternating signals, a plurality of transducers are provided and wherein the transducers in the plurality are disposed in stacked relationship and wherein the gaps in the successive transducers in the stack are angularly displaced from one another in a particular relationship and wherein the transducers are connected to receive the signals from the alternating signal means.

2. In combination, an annular tubular member provide with a gap extending the axial length of the member with a restricted circumferential length, the tubular member being provided with particular thickness to vibrate at a particular frequency in accordance with such particular thickness and being provided with properties to provide such vibrations, the tubular member being provided with an inner wall, the tubular member free at every annular position, except for nodal positions, for displacement, the annular tubular member being provided with at least one nodal position, a plurality of polarized sectionalized transducer elements arrayed within the tubular member in abutting relationship to one another and to the inner wall of the tubular member along the annular surface of the tubular member to provide from an unrestrained vibration of the tubular member at every annular position on the member, except for the at least one nodal position, the elements having properties of vibrating in accordance with the introduction of alternating current signals to the elements and all of the elements being bonded to the inner wall of the tubular member at progressive positions along such inner wall to produce vibrations of the tubular member at the particular frequency, and means operatively coupled to the polarized sectionalized transducer elements to introduce alternating current signals to the elements at the particular frequency to produce vibrations of such elements.

the annular tubular member comprising a plurality a tubular members and individual pluralities of polarized sectionalized transducer elements are associated with individual ones of the tubular members and the tubular members are disposed in stacked relationship with their gaps displaced in the annular direction in a particular phase relationship to produce acoustic waves with particular directional characteristics.

* * * * *